United States Patent [19]

Alvarenga et al.

[11] Patent Number: 5,737,730
[45] Date of Patent: Apr. 7, 1998

[54] MEASURING PROCESS FOR MEASURING CHARGEABLE ELECTRICAL CONSUMPTION FROM AN ELECTRICAL NETWORK AND ELECTRONIC ELECTRICITY METER

[75] Inventors: Landulfo Mosqueira Alvarenga; Roberto Pereira Caldas; Milton Lippincott, all of Rio de Janeiro, Brazil

[73] Assignee: Centro De Pesquisas De Energia Eletrica--Cepel, Rio de Janeiro, Brazil

[21] Appl. No.: 669,449

[22] PCT Filed: Jan. 11, 1995

[86] PCT No.: PCT/BR95/00001

§ 371 Date: Jul. 3, 1996

§ 102(e) Date: Jul. 3, 1996

[87] PCT Pub. No.: WO95/19573

PCT Pub. Date: Jul. 20, 1995

[30] Foreign Application Priority Data

Jan. 12, 1994 [BR] Brazil ............................ 9400084

[51] Int. Cl.⁶ .................... G01R 21/06; G01R 17/02; G01R 17/00
[52] U.S. Cl. ................ 705/412; 324/140 R; 324/140 D; 324/141; 324/142; 364/483
[58] Field of Search ............. 324/140 R, 141, 324/142, 140 D; 340/637, 870.02; 364/464.22, 483; 705/412

[56] References Cited

U.S. PATENT DOCUMENTS

| | | | |
|---|---|---|---|
| 3,517,311 | 6/1970 | Wasielewski et al. | 324/311 |
| 4,551,812 | 11/1985 | Gurr et al. | 364/492 |
| 5,198,751 | 3/1993 | Nakamura | 324/142 X |
| 5,298,856 | 3/1994 | McEachern et al. | 324/142 |
| 5,627,759 | 5/1997 | Bearden et al. | 364/483 |

FOREIGN PATENT DOCUMENTS

| | | |
|---|---|---|
| A 432 386 | 6/1991 | European Pat. Off. |
| A 2 488 998 | 2/1982 | France. |
| 2 694 405 | 2/1994 | France. |
| 24 44 451 | 3/1976 | Germany. |

*Primary Examiner*—Edward R. Cosimano
*Attorney, Agent, or Firm*—Beveridge, DeGrandi, Weilacher, & Young, LLP

[57] ABSTRACT

A process for measuring electricity consumption, especially suitable for small consumers, comprises the steps of continuously measuring consumer current, integrating the current with time to obtain a value (A.h) relating to consumption; adjusting the integration in function of the voltage of the network to obtain an adjusted value ($A_v$.h) proportional to a preestablished unit of electricity consumption; and computing the number of preestablished units obtained to provide a value proportional to chargeable electricity consumption. The adjustment to the integration is carried out in accordance with four bands of network voltage, in the form of a nominal band on either side of the nominal network voltage, an overvoltage band, an extended voltage band below the nominal band, and an undervoltage band. An electricity meter for performing the process includes a current transformer (TC) having a primary which is the consumer load line (15) and a secondary which generates a current representative of the current in the load line, a circuit connected to the secondary to integrate the value of such current with time, a detector for detecting when the integration circuit reaches a preestablished chargeable unit value of consumption of electricity, and a counter associated with the detector to sum the detected units of consumption.

21 Claims, 6 Drawing Sheets

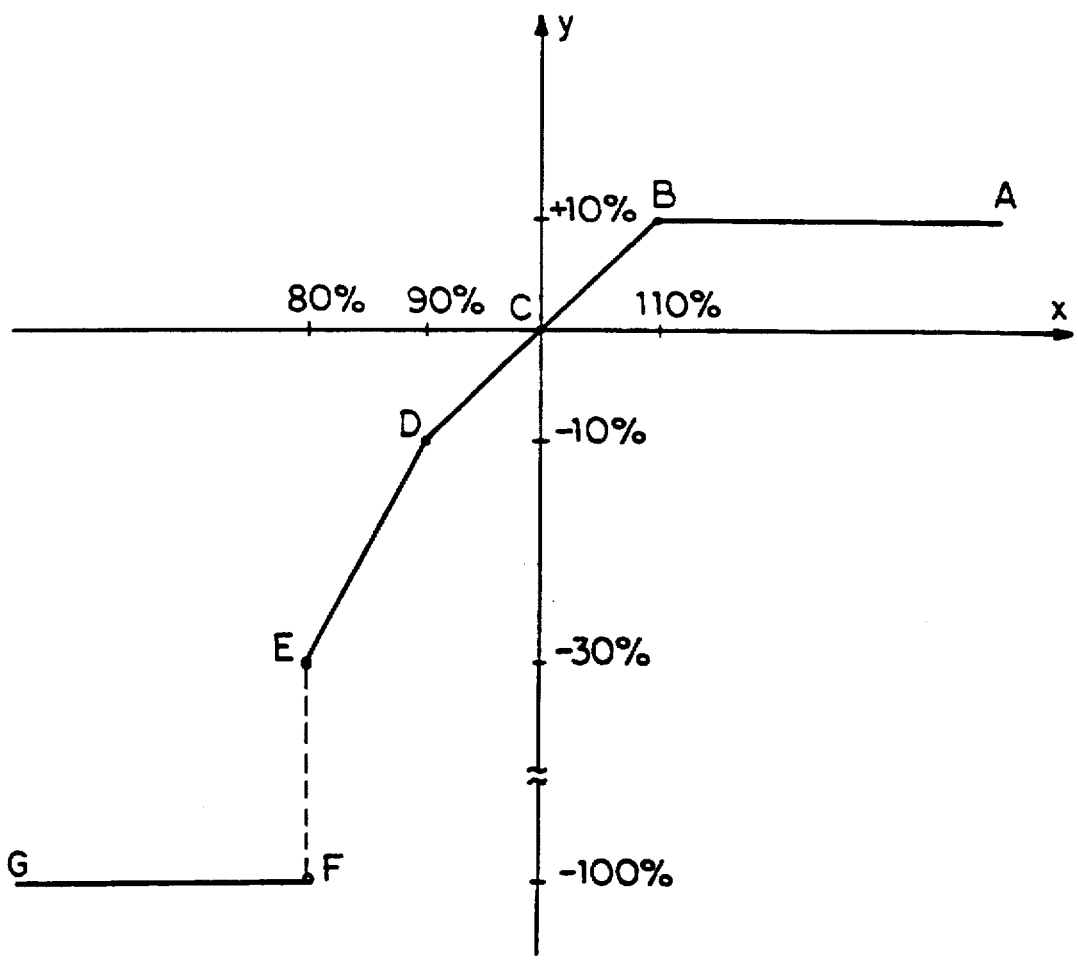
F I G. 1

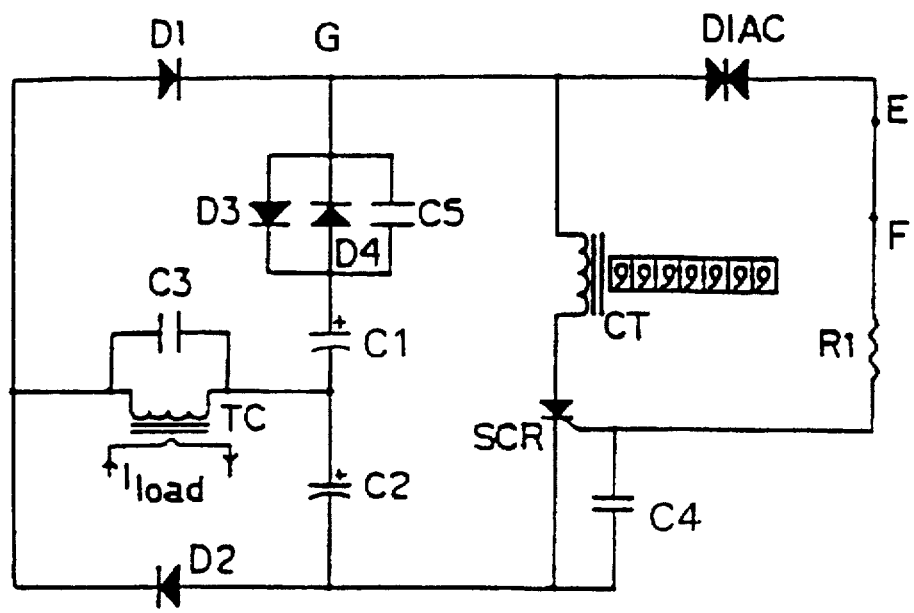
F I G. 2
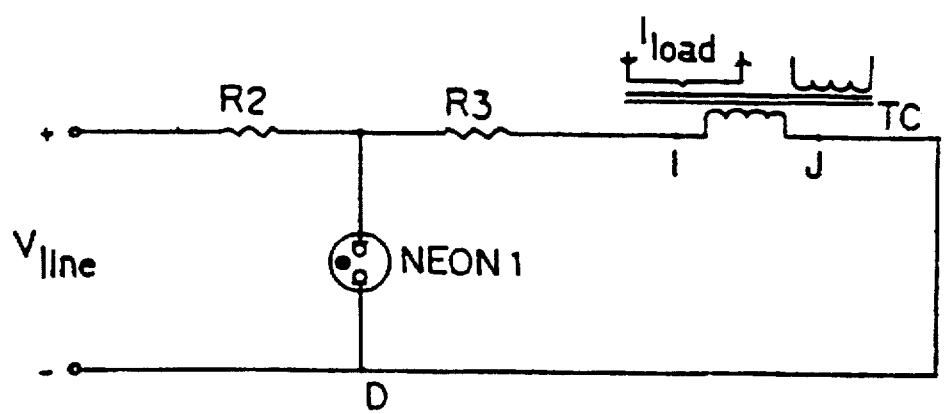
F I G. 3

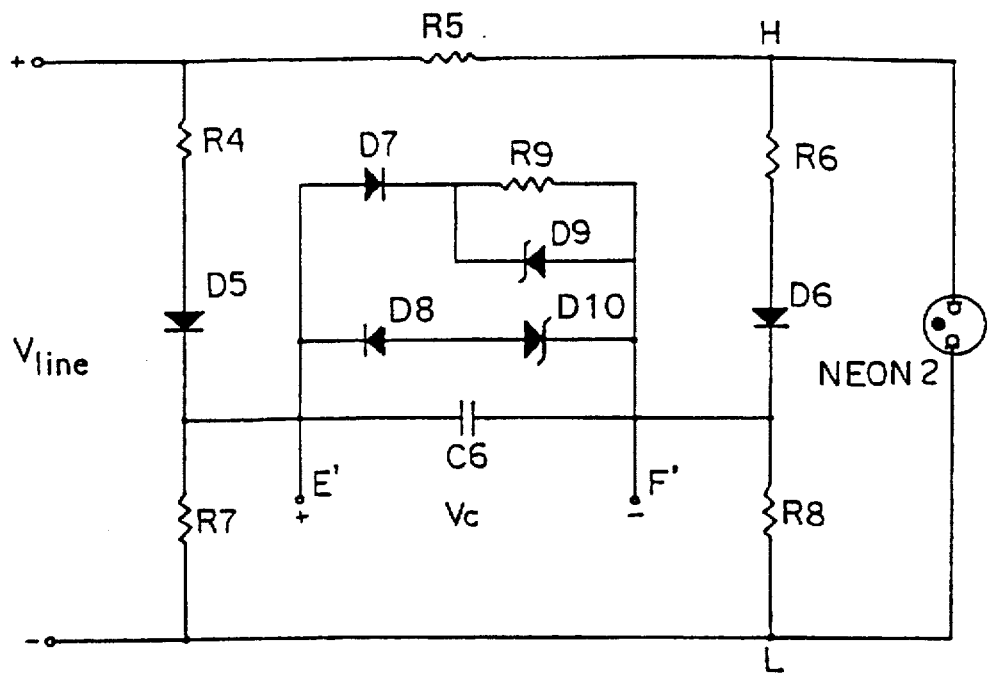
F I G. 4
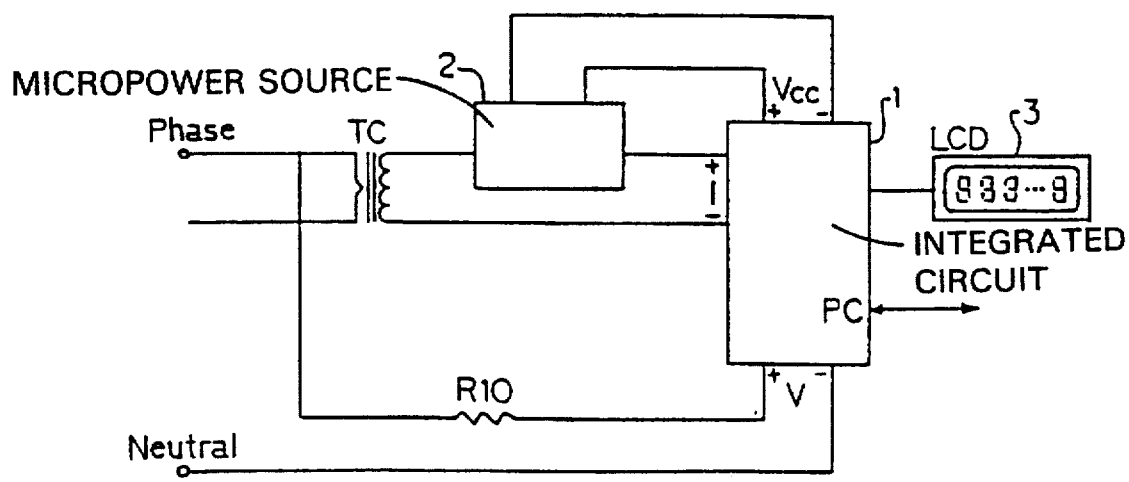
F I G. 5

MEASURING PROCESS FOR MEASURING CHARGEABLE ELECTRICAL CONSUMPTION FROM AN ELECTRICAL NETWORK AND ELECTRONIC ELECTRICITY METER

The present invention refers to a process and an electronic electricity meter, preferably for measuring the consumption of small consumers of electrical energy, such as the inhabitants at the peripheries of large towns and in the country.

Many distributors of electrical energy presently have to face a serious difficulty related to the large number of consumers in the region of a lower billing limit which in Brazil, for example, is around 30 kWh/month (known as the minimum compulsory tariff). The billing of such consumers frequently fails to recompense the distributors for their investments made in installations, principally with respect to the installation of electricity meters. The simplest conventional meter, that is to say, an electromechanical single phase meter, as described in the "Electrical Metermen's Handbook", 7th Edition, edited in 1965 by the Edison Electric Institute, is the product of a technology over a hundred years old that has undergone a long period of improvements and cost reductions and which no longer appears to be suitable for further simplification or cost reduction. On the other hand, meters using electronic technology, such as that taught in French patent FR 2.555.318, do not result in cost reduction but rather only in the simplicity of implementation of multiple functions at reduced increased costs and this has justified their application only for larger consumers.

This is due to the relatively high cost of electronic circuits for calculating electrical energy and of auxiliary power and protection circuits which are characteristic of state-of-the-art meters.

In the case of cost reduction of electronic circuits for the calculation of electrical energy, French patent FR 2.694.405 proposes a simplification of the measurement process, reducing the complexity of the circuits and of the overall cost.

This approach involves the evaluation of electrical consumption by altering the electrical quantity being measured. The normally used quantity is active energy obtained by integrating, with respect to time, the active power which, in its turn, is given by $$P=V.I.(\text{power factor}) \text{ or } P=V.I. \cos \phi,$$

where:

V is the voltage modulus of voltage of the electrical main supply;

I is the electrical current modulus produced by the load based on V; and

φ is the phase angle between V̄ and Ī (the electrical signals with time, corresponding to voltage and current, respectively).

Simplification of the measurement process is obtained by evaluating the electrical consumption only from the electrical current I, or from the combination of the electrical current I and from the voltage V, ignoring in both cases the information relating to the difference in the phase angle φ. In the former case, corresponding only to the use of the current I, the basic quantity is the ampere-hour (A.h) and, in the latter case, the Volt.Ampere-hour (V.A.h).

Dispensing the φ information results in a substantial cost reduction of the electronic circuits responsible for the measurement, although other measurements become necessary to maximise the reduction of costs, that is to say, the elimination of the auxiliary measurement and protection circuits, characteristic of the prior art, since it is international practise to use the line voltage as a power source for the electronic circuits of meters.

Another aspect that has become fundamental in the analysis and conception of electrical consumption measurement is the Quality of the Energy.

Modern electrical energy distribution systems, which today constitute large interconnected networks, in many cases cater for millions of consumers simultaneously. These consumers have the most diverse characteristics, as in the case of the residential/commercial segment where there is the massive use of electro-domestic appliances, computers and fluorescent type lighting; and in the industrial segment, where there are heavy loads used intermittently using electronic switches (thyristor type).

The final result is an increasing pollution of the distribution network, principally in terms of the appearance of parasitic frequencies in the system, multiples of the fundamental frequency (50 or 60 Hz), the said harmonics, and reduction of the power factor quality of the supply itself. In this case, one must consider eventual irregularities in the supply of the electrical voltage to which the distribution system is subject.

Overvoltages, for example, characterised by the supply of an electrical voltage modulus superior to the maximum electrical voltage permitted in the system, reduces the life of incandescent lights and unnecessarily increases the consumption of electrical motors and electrodomestic appliances. In the case of undervoltages (voltages inferior to the minimum permissible), there is a considerable reduction in the efficiency of motors/compressors being used, for example, in air conditioners and refrigerators, and a drop in the lighting efficiency of lamps.

In view of these observations, it is easy to see that the prior art efforts have not arrived at a single solution with the necessary qualities, all at the same time. Such qualities are:

scope of the above mentioned aspects regarding the quality of the energy, both on the consumer side and on the supply side;

reduced cost that permits a wider application, catering to a market of tens of millions of consumers that comprise the worldwide distribution system.

This will become clear from the following brief discussion of a typical prior art approach.

DISCUSSION OF THE PRIOR ART the cost aspect is considered in above mentioned French patent FR 2.694.405, although such patent does not exhaust the existing possibilities, apart from ignoring important aspects relating to the quality of the supply as, for example, measurements related to overvoltages and undervoltages in the electrical supply network;

one aspect related to the quality of consumption, the power factor, is considered in U.S. Pat. No. 5,198,751 in an isolated manner, through the conception of a reactive Volt.Ampere-hour meter (V.A.h). This approach merely complements conventional measurement (active energy) which is still necessary and does not, therefore, satisfy the principle of low cost nor does it provide measures regarding the quality of the supply (overvoltage and undervoltage) and the presence of parasitic harmonics in the network;

as EP patents 2 444 451 and 0 432 386 refer to complex meter implementations which, by means of a large number of subcircuits, attempt to extract the largest amount of information possible regarding electrical consumption and supply conditions. This approach invariably leads to naturally expensive solutions of restricted application and difficult utilisation in view of the large quantity of simultaneous information regarding the system with which the distributors are obliged to work in order to arrive at a final value to be charged to the consumer for the service of supplying electrical energy;

U.S. Pat. No. 5,298,856 even further increases the level of complexity in relation to above mentioned U.S. Pat. No. 5,598,751, in defining an adjusted V.A.h meter using various internal tables relating to the presence of parasitic harmonic frequencies that might be present in the electrical supply network. It is therefore a solution that does not satisfy the aspects relating to the quality of supply (overvoltage and undervoltage) and only complement the conventional measurement (active energy), apart from being of elevated cost in view of the complexity of the circuits.

With a view to proposing a solution that meets the above mentioned requirements of reduced cost and scope relating to the aspects of quality, both in supply and consumption, this invention provides a measuring process and an electronic meter for billing electrical consumption, with innovating characteristics compared with the prior art solutions.

According to the present invention, a measuring process for measuring chargeable electrical consumption from an electrical network, comprises the steps of a) carrying out a permanent measurement of the current of the consumer; b) integrating the value of the measured current with respect to time until a value (A.h) is obtained relative to the electrical consumption by the consumer; c) adjusting the integration of step b) in function of the electrical voltage of the network until an adjusted value $A_v.h$) is obtained that is proportional to a preestablished unit of electrical consumption; and d) computing the number of preestablished units obtained so as to obtain a value proportional to the electrical consumption chargeable up to any given moment.

The correction of step c) is preferably carried out in preestablished proportions in accordance with bands of deviation of the voltage of the network from the nominal voltage of the network. In the presently preferred embodiment of the invention, such bands comprise:

a first nominal voltage band on either side of the nominal voltage of the network;

a second overvoltage band;

a third extended voltage band, lower than the first nominal band; and a fourth subvoltage band, lower than the third extended voltage band.

The correction within the first band can increase linearly from a first negative value at the lower end of the first band to a first positive value at the upper end of the first band, the correction within the second overvoltage band may be constant and equal to the said first positive value, the correction within the third extended voltage band may be increased linearly at a greater rate than that in the first band, from a second negative value at its lower end up to the said first negative value at its upper end, and the correction in the fourth band may be constant, preferably 100% negative.

In the preferred embodiment of the invention, the linear rate of increase in the third band is the double of the linear rate of correction in the first band, whereas the first positive value is +10% and the first negative value is −10%.

Further in accordance with the present invention, an electronic electricity meter for measuring chargeable electrical consumption from an electrical supply network, comprises a circuit, without a power source, defined by a current transformer (TC) adapted to be associated, as a primary, with the consumer load line, the transformer having a secondary winding adapted to generate a current representative of the consumer load line current, an integrating circuit connected to said secondary winding to integrate the value of the current in the secondary winding with respect to time, detector means for detecting when the value integrated by the integrating circuit reaches a preestablished unitary value chargeable as a unit of electrical consumption and counter means associated with the detector means to sum the detected units of electrical consumption.

THE INVENTION

The invention, according to a first aspect relating to the measurement process, permits a complete separation between the supply and consumer systems.

The basic concept used is that the supply system is characterised by the voltage present in the electrical network, whereas the consumer is defined by the electrical current that it draws from that supply network. By integrating the current drawn by the consumer with respect to time, according to a relative adjustment depending on the value of the voltage supplied by the network system, it is possible to establish a single quantity that is simply calculated which leads to a conception of less expensive meters and which attends the above mentioned concepts of quality of energy.

The integration of the electric current, which characterises the consumer, permits power- and spurious harmonic frequency generation-related aspects to be covered, which are two fundamental items for the quality of consumption. This occurs because the overall value of the electric current establishes the efficiency with which the consumer uses the electrical network. An easily understandable example is that of a non-compensated electric motor that has a power factor less than unity due to the inductive characteristics of its electrical insulation, this causing the appearance of reactive energy during its operation. Such reactive energy is part of the overall energy, which is not directly associated with the work done by the motor, causing the appearance of a parasitic component of electric current in the conductors of the electrical supply network. In other words, the final result is a current that is larger than that necessary to meet the original work requirements. This increase overloads the supply network, reducing its efficiency or even causing damage in the conductors, transformers and other network components.

The same applies to loads that cause the appearance of currents having spurious harmonic frequencies in the electrical network. Such currents and parasitic currents are not associated with the work to be done, be it lighting, heating, power supply for electronic equipment or the like.

The measuring process of the present invention, in considering the integration of the overall current with respect to time, simultaneously sums the active, reactive and harmonic fractions that might be generated by the consumer. This naturally leads to a better quality of consumption since the more efficient the use of the network by the consumer (causing fewer parasite currents), the lower the final cost to him.

In complementation to the consumer current integration, as described above, the process of the present invention associates the adjustment of such integration with the voltage conditions of the supply system. This adjustment or correction, as mentioned, may take into consideration four regions or bands relating to the operation of the distribution system, as below described and denominated:

a nominal voltage band of the network;

an overvoltage band;

an extended voltage band of the network; and a subvoltage band.

The first, nominal band, region, corresponds to the normal limits of variation of mains voltage, which are already incorporated in the calculation of electrical loads represented by electrodomestic appliances, lamps and motors.

The second, overvoltage, region corresponds to a band that begins at the lower limit of the nominal band.

The third, extended, region corresponds to a narrow band located right below the lower limit of the nominal band. In this region the operation of loads may be executed inefficiently, as in the case of motors/compressors, but without presenting operating risks.

The fourth, undervoltage, region corresponds to situations where the voltage is less than those of the extended band and where operation of electrical loads should be avoided due to very high inefficiency or to a risk situation.

Once these regions have been discriminated, the presently contemplated measurement process may add information of the supply system behaviour to the consumer current integration. This characteristic differentiates the present invention from other prior art approaches that use a direct calculation of the energy, reactive energy or apparent energy, preventing the necessary separation between the components of the supply system and that of the consumer. It is also differentiated from other techniques that consider a large number of electrical quantities at the same time, make the measuring system expensive and make the tariff calculation process a complex and specialised task, as occurs in the case of EP 0 432 386 and U.S. Pat. No. 5,298,856.

Before a more detailed description of the measurement process that constitutes the first aspect of the invention, the basic principles of a second aspect thereof will now be described, which refers to circuitry for implementing meters, using innovating technology when compared with that of the prior art.

One of the innovating concepts used is that of permitting the functioning of the electronic circuits of the meters described herein using an internal source based on the consumer current rather than on the electric voltage supplied by the distribution network.

Based on this quantity—electric current—it is possible to conceive various simple and inexpensive types of equipment which nevertheless are capable of evolving easily and naturally in terms of their functions:

a first example relates to equipment that only measures and records the electric current drawn by the consumer. The quantity presented is the A.h (Ampère-hour), that is to say, the integral of the current with respect to time. Equipment of this type finds application where, for technical and/or economic reasons, there is no necessity to consider possible voltage fluctuations in the distribution network for which adjustments should be made in the integral of the current. This case serves the focal point of the invention: small monthly consumers of electrical energy. A.h measurement permits the implementation of extremely robust, simple and inexpensive circuitry which does not require a separate source nor protection devices. Apart from this, they may be made from components that already exist on the market and, even so, the final price of the product is lower than that of conventional active energy (W.h) measurement devices;

a second example refers to the incorporation in the Ah meter mentioned above of circuits that take into consideration variations in the electrical network voltage. The quantity measured is $A_v.h$, that is to say, Ampère-hour adjusted in accordance with the average network voltage, according to the concept of the first aspect of the invention. It may be used where the consumer is sufficiently large to justify it or in locations where the voltage is subject significant variations;

a third and last example refers to the application very low consumption and low operating voltage integrated circuit technology, such as is used in digital wrist watches and apparatuses such as heart pacers. By applying this concept, it is possible to implement an electronic meter capable of operating both as an A.h meter and as an $A_v.h$ meter, or even as a W.h meter, offering functions of communication with external reading and/or command devices based on a source still based on the consumer current.

Since the meters of the three examples above are based on consumer current, there is no necessity to use external connections or overvoltage protection devices. This eliminates connectors, terminals and copper clamps and it is possible to use a housing capable of accommodating the internal components, that is made, for example, by moulding or injection of plastic resin. A housing of this type is easily made, inexpensive and may be dust-proof, water-proof and protected from foreign bodies in general. It may also be of reduced dimensions and weight which simplifies the installation regulations of electric energy distributors.

A meter implemented according to such principles does not suffer the failures that are common to the prior art, such as failure of meters caused by oxidation or overheating of the terminals or, furthermore, by burning of internal elements that are connected to the mains voltage, due to lightning striking overhead power lines.

SHORT DESCRIPTION OF THE DRAWINGS

Now the concepts and basic principles of the first and second aspects of the invention have been explained, the preferred embodiments will now be described with reference to the accompanying drawings, in which:

FIG. 1 is an explanatory graph showing the supply conditions of the voltage of an electric network, illustrating four regions relating to the operation of the distribution system;

FIG. 2 is a schematic diagram of the basic circuit that constitutes the equipment for measuring A.h;

FIG. 3 is a schematic diagram of an auxiliary circuit that may be added to the circuit of FIG. 2, to permit for the compensation of errors introduced by the meter current transformer, relating to the magnetisation current of the ferromagnetic material used in its construction;

FIG. 4 is a schematic diagram of an auxiliary circuit that may be added to that of FIG. 2, to permit an adjustment of the integration of consumer current in accordance with the supply conditions of the voltage of the electric network;

FIG. 5 is a block diagram of an embodiment of the invention that uses low consumption, low operating voltage integrated circuit technology ("micro power/low voltage");

Figure 7:
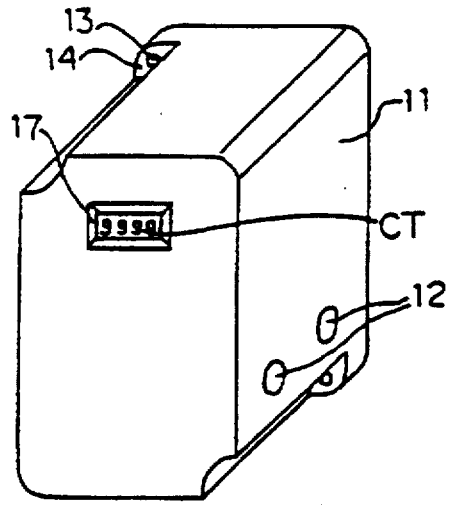
FIG. 7 shows a typical implementation of the housing of a meter according to this invention.
Figure 8:
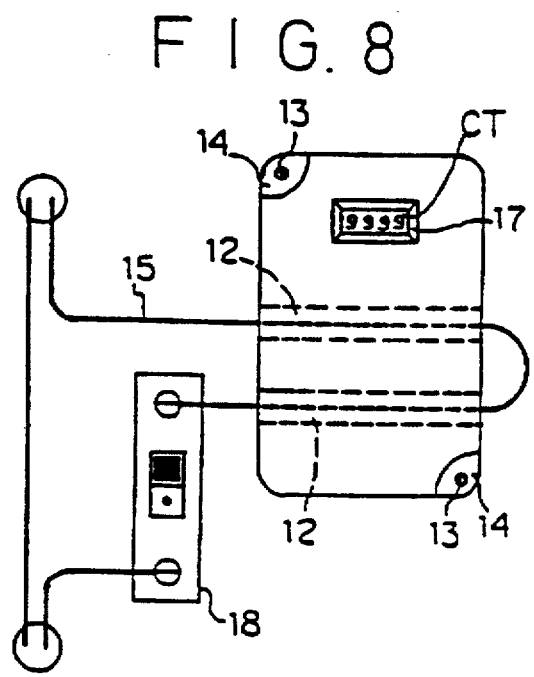

FIG. 8 exemplifies the installation of the meter of FIG. 7; and

Figure 9A:
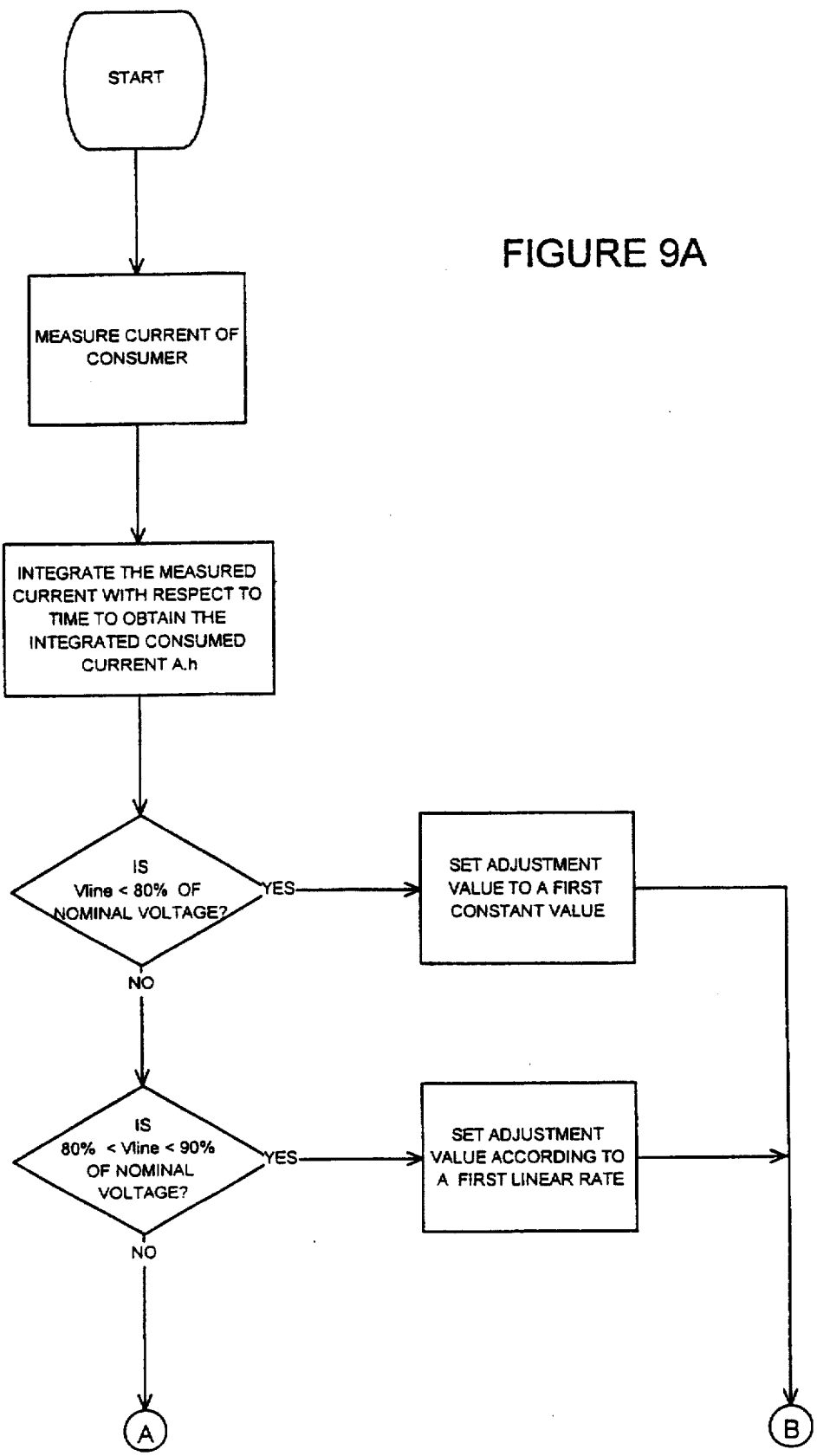
Figure 9B:
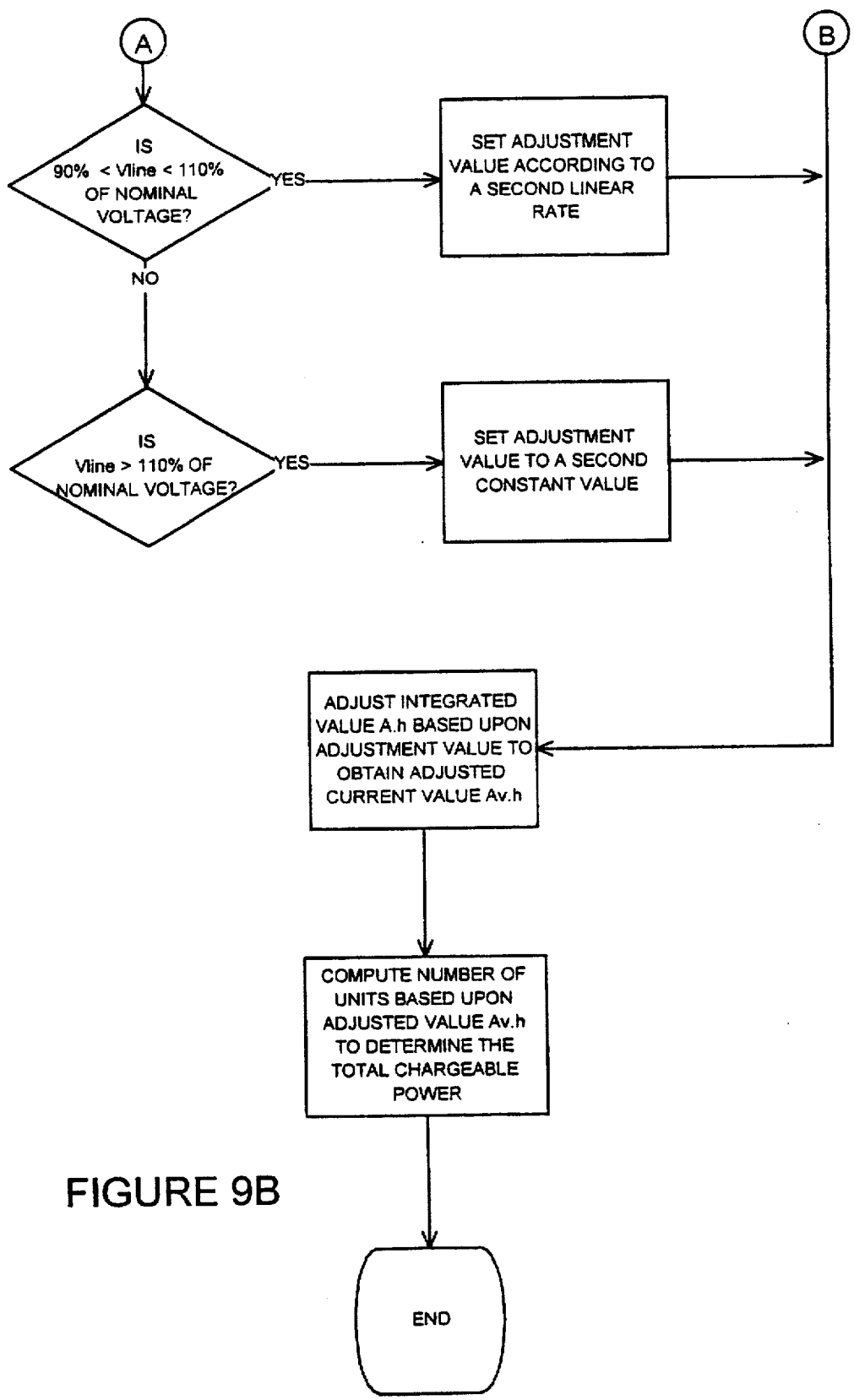

FIGS. 9A and 9B show a flow chart which illustrates the steps performed in practicing the invention.

DETAILED DESCRIPTION OF THE DRAWINGS

FIG. 1 shows in a simplified manner a preferred embodiment of the first aspect of the invention, that is to say, a measuring process based on the integration of the current relative to time, adjusted by the conditions of the mains voltage supplied by an electricity distribution network.

The basic elements of the graph of FIG. 1 are as follows:

x-axis: voltage condition of the mains voltage. The values established in terms of percentage, with respect to the nominal value of the operating voltage of the network are plotted on this axis. The points relating to 80%, 90% and 110% of the nominal mains voltage are indicated;

y-axis: correction to the integral of consumer current. The correction values for each voltage value in the network are plotted on this axis. The points indicated represent corrections of +10%, -10%, -30% and 100%.

The curve defined by joining $\overline{AB}$, $\overline{BD}$, $\overline{DE}$ and $\overline{FG}$ establish the manner of correction according to the four regions of operation of the mains voltage, as previously described, that is to say: segment $\overline{AB}$ (overvoltage), $\overline{BD}$ (nominal band), $\overline{DE}$ (extended band) and $\overline{FG}$ (undervoltage). Point C corresponds to the nominal voltage condition (100%) and therefore zero correction of the integral of the current.

The application of the measurement process that results in the final calculation of a unique quantity, here denominated $A_v.h$ (consumer current integrated with respect to time, with adjustment according to the average mains voltage of the distribution network) will now be described.

The initial point of reference of the process corresponds to point C of FIG. 1. This point corresponds to the ideal condition of energy supply (100% nominal mains voltage) and there implies zero correction in the process of integration of the current. In this case, the consumer with a consumption free of parasitic currents, that is to say, a power factor of unity and the absence of harmonic frequencies in the current, will have its consumption measured and charged in a manner equivalent to the ideal form of active energy measured, for example, by a conventional kW.h meter.

As long as the mains voltage variation is maintained within the limits of the nominal band (segment $\overline{BD}$), the measurement will continue equivalent to that which would be effected by a conventional active energy meter, provided there are no parasitic currents. In other words, for a given current, a variation of ±10% in the mains voltage, which means an equivalent increase/reduction of active energy supplied by the system, will correspond to a correction of ±10% in the billing of the consumption, according to the process of the present invention.

In the case of overvoltage (segment $\overline{AB}$), where the service represented by the voltage supplied by the distribution system does not provide the consumer with any additional benefit, as mentioned above, a fixed correction will be used in the measurement process, equivalent to the maximum limit of +10% (upper limit for correction in the nominal voltage band).

In this manner a fair tariff is obtained, since there is no tariff increase when there is no additional benefit for the consumer in an overvoltage situation.

In the case of segment $\overline{DE}$ (extended band), where the voltage varies between 80% and 90% of the nominal line voltage of the network, there is already a decrease in the efficiency of loads such as motors and lamps and, in the case of motors/compressors (refrigerators, air conditioners, etc.) there is a appreciable increase in the production of eddy currents, due to the reduction in the power factor. Since such phenomena are caused exclusively by the drop in the supply voltage below the established nominal band, it is fair that there is a compensation capable of attending to the worst case of behaviour of the load of the consumer. Segment $\overline{DE}$, which has twice the slope as compared to $\overline{BD}$ (nominal band), is intended to meet this requirement, establishing, for example, an adjustment of -30% for a variation of 20% in line voltage.

In the case of undervoltage (segment $\overline{FG}$), a region in which there is accentuated inefficiency or even danger in the operation of loads, such as for example, motors/compressors that can seize, causing overheating due to elevated currents, registration of the consumption may be cancelled (-100% correction), once more determining a fair situation in the relation supply/consumption/tariff.

It should be emphasised that the basic concept presented here may be implemented in other ways, such as, for example, by altering the values of variation of voltage and adjustment that define the above segments, without deviating from the basic concept of the present invention.

FIGS. 9A and 9B provides a flow chart, which illustrates the operation of a preferred embodiment of the invention.

Referring now to FIG. 2, which illustrates a schematic diagram of the basic circuit for the measuring equipment, it is seen that the electronic components that comprise the circuit are as follows:

TC—current transformer. This functions as a load current sensor ($I_{load}$) providing the circuit with a current having a magnitude suitable for the processing of the electronic circuits and proportional to the load current;

D1 and D2—rectifier diodes. These rectify the secondary of the TC, functioning alternately: D1 in the positive half cycle and D2 in the negative half cycle;

C1 and C2—Electrolytic capacitors. These are responsible for storing the consumption indicating current with time;

C3—Capacitor. This works together with the TC. Its function is to compensate for errors of non-linearity of the TC at low currents;

SCR—Silicon controlled rectifier. This acts as an electronic switch that is activated to generate a current pulse activate the cyclometer (counter) due to the discharge of C1 and C2. Its activation is effected by the voltage level at its trigger electrode. Deactivation occurs with the complete discharge of C1 and C2.

DIAC—A two terminal device that acts as a voltage level controlled switch. Its function is such that, whenever the voltage between its terminals reaches the trip value, the SCR is activated;

R1—Carbon resistor. Its function is to limit the current, protecting the DIAC and the SCR;

C4—Capacitor. Its function is to desensibilise the SCR trigger, preventing it to be activated erroneously due to noise;

Group D3, D4 and C5—Auxiliary circuit. Its function is to facilitate the actuation of the DIAC, guaranteeing that the latter is always activated by the same quantity of current accumulated with time in C1 and C2.

Cyclometer (counter) CT—electromechanical register or counter. Its function is effect a non-volatile storage of the consumption measured in time. It comprises seven coaxial cylinders, each divided into ten equal parts where the algorithms 0 to 9 are written, and by a coil that commands the movement of the cylinders due to the current therethrough.

The operation of the circuit is basically as follows:

The load current (consumed by the contributor) is transformed by the TC, which provides the circuit with a current proportional thereto and of a reduced value. This current is then rectified by D1 and D2 and stored with time in C1 and C2. This makes the potential between points G and E rise slowly. When this voltage reaches the firing threshold of the DIAC, the latter is activated which in its turn activates the SCR which then conducts to discharge C2 and C3, generating a pulse that actuates the cyclometer or electromechanical counter CT. This makes the cyclometer record the occurrence of one pulse proportional to the consumption of a given amount of A.h.

As can be seen from FIG. 2, the circuit dispenses the use of a power source or of auxiliary overvoltage protection devices, whereby it comprises a highly robust, low cost solution, manufactured from inexpensive non-dedicated commercial components.

FIG. 3 shows a schematic diagram of an auxiliary circuit that may be added to the basic circuit described above, for compensating errors derived from the TC due to the magnetisation current.

The electronic components that make up this circuit are as follows:

R2—Carbon resistor. This functions as a current limiter, protecting the NEON1 lamp and determining its operating current;

R3—Carbon resistor. This establishes the current that is desired to pass through the winding I-J of the TC;

NEON1—Neon lamp. This acts as a voltage regulator; and

TC—Current transformer. This is the same TC shown in FIG. 2, with the addition of another primary winding (I-J), which provides a current approximately the same as the magnetisation current of the core of the TC, compensating errors that occur when the circuit is measuring very low currents.

The operation of the circuit is basically as follows:

The mains voltage is regulated by the NEON1 lamp. Resistor R2, apart from establishing the operating current of NEON1, limits it to prevent damage to the lamp in overvoltage conditions. Resistor R3 establishes a current in winding I-J of the TC from the voltage of the NEON1 lamp. This current flows continuously through the winding I-J, supplying the core of the TC with the necessary magnetisation current.

FIG. 4 shows a schematic diagram of an auxiliary circuit that can be added to the basic circuit of FIG. 2, to permit an adjustment to the integral of the current based on variations of the network voltage. The circuit thus configured permits the measurement of Ampere-hours corrected by the average network voltage ($A_v$.h). The addition of this circuit is made by taking away the short circuit E-F (FIG. 2) and connecting points E' and F' (FIG. 4) respectively to corresponding terminals E and F (FIG. 2).

The electronic components that make up this circuit are as follows:

D5 and D6—rectifier diodes. They act to rectify the alternating voltage of the network;

R4, R5, R6, R7 and R8—carbon resistors. They function as voltage dividers;

C6—capacitor. It acts to reduce the alternating current impedance between points E' and F', and filter sudden variations in the voltage $V_c$;

NEON2—neon lamp actuating as a voltage regulator;

D7 and D8—rectifier diodes;

D9 and D10—controlled avalanche diodes (Zener); and

R9—carbon resistor.

The operation of the circuit is basically as follows:

The network voltage is rectified by the diodes D5 and D6.

The voltage between the points H and L is regulated by NEON2. The voltage divider formed by R6 and R8 establishes the voltage at point F'. The voltage divider formed by R4 and R7 establishes the voltage at point E'. Variations in line voltage are sensed proportionally at point E'. Since the voltage at point F' is approximately constant due to the presence of NEON2, the voltage $V_c$ (which is in series with the DISC of FIG. 2) also suffers variations proportional to the variations in the line voltage, modifying the point of actuation of the SCR (FIG. 2), and, consequently, the rate of billing the consumption as indicated by the cyclometer.

When the line voltage is contained within the limits of the extended band (segment $\overline{DE}$ of FIG. 1), the voltage $V_c$ is slightly negative, due to the division factors established by resistors R4, R7, R6 and R8. In this manner, the rectifier diode D7 insulates elements R9 and D9 from the circuit, and the Zener diode D10 does not yet enter into operation. The voltage $V_c$, in this condition acts on the circuit of FIG. 2 so that the variations in the line voltage result in the double of the variation of the rate of counting the consumption. In other words, for a variation of 10% in the extended band, the circuit of FIG. 2, with the correction $V_c$ given by the circuit of FIG. 4, there is a variation corresponding to 20% in the counting of the consumption.

When the voltage in the network enters the undervoltage band (segment $\overline{FG}$ in FIG. 1), the voltage $V_c$ becomes sufficiently negative for the Zener diode D10 to be actuated, which $V_c$ remain at a fixed level corresponding to the variation obtained at point E in FIG. 1. This simplification corresponds to shifting segment $\overline{FG}$ up, so that it begins at point E of FIG. 1, this comprising a possible variation of the concepts of the first aspect of the present invention.

When the line voltage shifts to the nominal band (segment $\overline{BD}$ of FIG. 1), the voltage $V_c$ becomes slightly positive, whereby rectifier diode D7 permits actuation of resistor R9 in the circuit, but Zener diode D9 is still not activated. In this condition, the voltage $V_c$ accompanies, in a proportion of 1:1, the variations in the line voltage. In other words, the circuits of FIGS. 2 and 4 together present, for a variation of 10% in the line voltage, a corresponding variation in the rate of billing the consumption.

When the line voltage corresponds to the overvoltage band (segment $\overline{AB}$ in FIG. 1), voltage $V_c$ is sufficiently positive for Zener diode D9 to be activated, which establishes a fixed value level $V_c$. In this case, the circuit of FIG. 4 establishes a fixed positive correction in the rate of counting the consumption by means of the circuit of FIG. 2, in accordance with the principle set forth with reference to FIG. 1 (segment $\overline{AB}$).

FIG. 5 is a block diagram of one embodiment of the invention, using the application of micropower/low voltage type integrated circuit technology.

Taking into account the concept introduced by the present invention—the quantity that characterises electrical consumption is the current drawn by the consumer—equipment can be conceived, as shown in FIG. 5, that depends exclusively on consumer current for its operation, but which, even so, is capable of handling more than one quantity relative to electrical consumption.

A first step in this direction is the use micropower/low voltage, technology as is commonly used in the construction of wrist watches and heart pacers. Circuits of this type use micropower sources which, for their operation, may be based on a minute amount of electric current circulating in an external circuit. Thus, a single current transformer can provide not only the current representing the electrical consumption to be measured, but also the power for feeding the measuring circuit when the latter is based on micropower/low voltage technology.

The measuring circuit may then establish, based on the current provided by the current transformer and a sample of the line voltage by means of a voltage sensor, quantities such as Ampere-hour (A.h), Ampère-hour adjusted by the average line voltage ($A_v$.h), according to the principles established in FIG. 1, and finally even active energy (W.h).

Since the measuring circuit depends only upon the consumer current for its operation, if the line voltage sensor fails or there is an attempt at fraud by purposely disconnecting it, the circuit can continue functioning by considering, for example, that the line voltage is nominal and the power factor unity, whereby consumption will be billed in accordance with the normal supply conditions of the network.

This characteristic permits one to use housings for the meter elements according to the invention, which dispense with screws, terminals and consumer load current conductors. This is because there is no necessity to interrupt the electric circuit of the consumer to guarantee the supply of electric energy to the internal circuits of the meter, as is required in the prior art. This invention therefore permits the use of highly dependable, low cost solutions when compared with those of the prior art.

In order to illustrate these aspects, FIGS. 5 and 6 will now be described in detail. In this embodiment, the measurement work is carried out by a dedicated integrated circuit specifically designed to attend to the requirements of its function. The dedicated integrated circuit (CI) 1 should have a very low consumption, it being fed by a micropower source 2 that withdraws only from the secondary of the current transformer energy to feed both the integrated circuit 1 and a liquid crystal display (LCD) 3. This display 3 is the element responsible for exteriorising the value representing the consumption measured by the equipment. The current transformer TC is responsible for supplying the integrated circuit 1 with a current sample I proportional to the current being consumed. Resistor R10 is responsible for supplying the integrated circuit 1 with a voltage sample V proportional to the line voltage.

In order to understand the functioning of circuit, one must first understand the internal architecture proposed for the dedicated integrated circuit.

Figure 6:
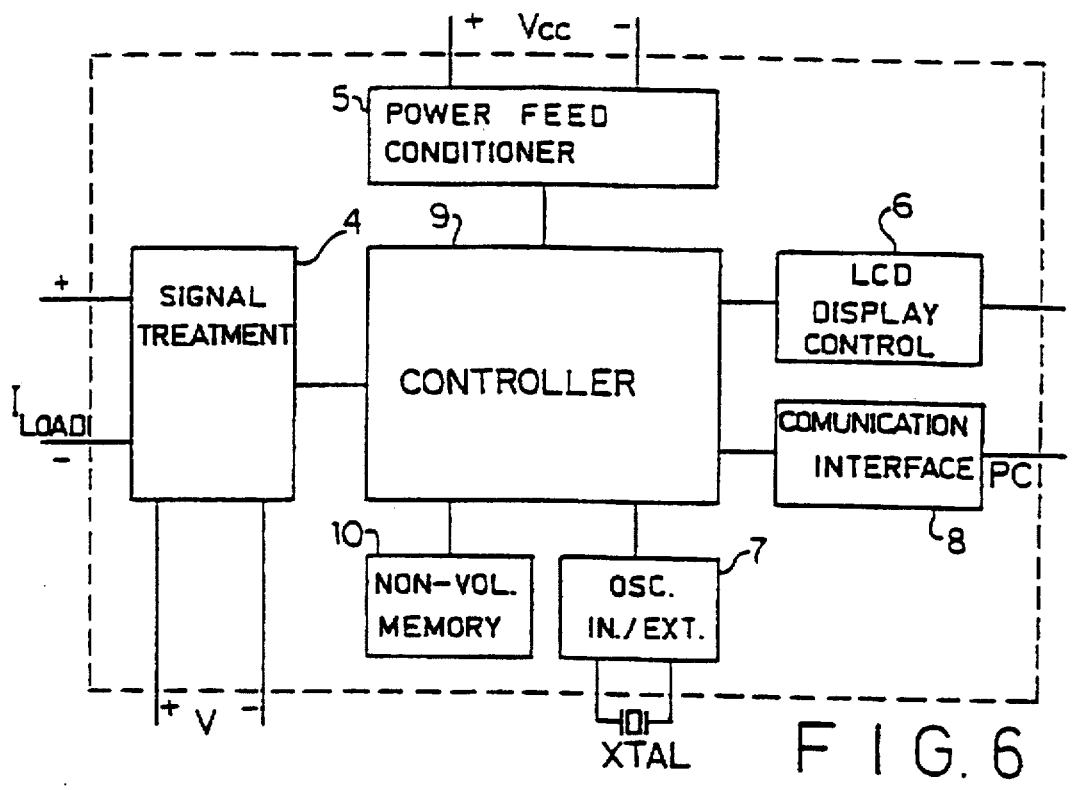
FIG. 6 is an internal block diagram of the integrated circuit shown in FIG. 5.

FIG. 6 is a block diagram of the internal architecture of the dedicated integrated circuit 1. The principal parts and their functions are as follows:

Signal Treatment Block 4—receives the current and voltage signals. It decides if the measurement is to be A.h, $A_v$.h or W.h. It compensates for the deficiencies in the linearity of the current transformer TC and supplies the adjustment for computing the consumption in accordance with the voltage V;

Power Feed Conditioner Block 5—receives power fed by the micropower source 2 and detects failure in the power feed $V_{cc}$;

LCD Display Control Block 6—sends signals for exteriorisation of the register of measured consumption in the display LCD 3;

Oscillator IN/EXT 7—responsible for the generation of the internal clock of the dedicated integrated circuit 1;

Communication Interface Block 8—responsible for the communication between the integrated circuit 1 and the outside world through the communications gate PC. It permits programming of the dedicated integrated circuit 1, making its operation versatile and permitting the use of external devices that can implement differentiated tariffs, remote reading and the like;

Controller 9—responsible for the internal control of the reining blocks of the dedicated integrated circuit 1. Based on the voltage and current signal V and I, it establishes the measurement quantities in the form of Ampère-hours adjusted by the voltage V and Watt-hours. If a power failure is detected by the power conditioner block 5, it transfers the computation of the consumption to the non-volatile memory block 10;

Non-volatile Memory Block 10—this block, which is capable of indefinitely storing information on consumption, returns the information to the controller 9 with the return of the power supply so that normal operation can be restored.

Controller 9 is also responsible for overseeing the operation of the Communication Interface and the LCD control blocks—and 8 and 6, regarding the sets of information and commands exchanged with the external environment.

The actual implementation of these blocks is not difficult for a person versed in the art, the technology itself not forming part of the present invention.

FIG. 7 shows a typical embodiment of a housing for containing a meter according to this invention, in its Ampère-hour version. As can be seen in FIG. 7, the housing 11 may be implemented as a single, monolithic part that is water-, dust- and gas-proof, as well as being protected from other bodies alien to its operation. Through holes 12 permit the phase conductor feeding the consumer to pass through the housing without interruption. Two orifices 13 in mounting ears 14 permit a simple and safe installation of the meter.

In FIG. 8, where it is possible to see a typical installation of the Ampère-hour meter of FIG. 7, one can see the passage for the consumer supply phase conductor 15. It can also be seen that a single (phase) conductor is sufficient for the operation of the meter since it conducts the basic information for the measurement (electric current), the neutral conductor passing directly to the consumer circuit without passing through the meter. FIGS. 7 and 8 also show the cyclometric register (counter) CT through a suitable window 17 in the housing 11.

Note should also be made of the simplicity and the reduced space necessary for installation, since the passage of conductor 15 through the meter permits a compaction of the supply network output (eletroduct-line), the input for the consumer circuit (eletroduct-load) and the usual protection device (cut-off) 18, in a minimal space.

It should be understood that only preferred embodiments of the present invention have been described and that numerous other implementations of the basic concepts of the invention are possible without departing from the subject matter to be protected in accordance with the definitions contained in the accompanying claims.

We claim:

1. Measuring process for measuring chargeable electrical consumption from an electrical network, characterised by comprising the steps of:
   a) carrying out a permanent measurement of the current of the consumer;
   b) integrating the value of the measured current with respect to time until a value, (A.h) is obtained relative to the electrical consumption by the consumer;
   c) adjusting the integration step b) in function of the electrical voltage of the network until an adjusted value ($A_v$.h) is obtained that is proportional to a preestablished unit of electrical consumption; and
   d) computing the number of preestablished units obtained so as to obtain a value proportional to the electrical consumption chargeable up to any given moment.

2. Process according to claim 1, wherein the correction of step c) is preferably carried out in preestablished proportions in accordance with bands of deviation of the voltage of the network from the nominal voltage of the network.

3. Process according to claim 2, wherein the said bands of deviation comprise:
   a first nominal voltage band on either side of the nominal voltage of the network;

a second overvoltage band;

a third extended voltage band, lower than the first nominal band; and a fourth subvoltage band, lower than the third extended voltage band.

4. Process according to claim 3, wherein the correction within the first band increases linearly, from a first negative value at the lower end of the first band to a first positive value at the upper end of the first band, the correction within the second overvoltage band is constant and equal to the said first positive value, the correction within the third extended voltage band increases linearly at a greater rate than that in the first band, from a second negative value at its lower end up to the said first negative value at its upper end, and the correction in the fourth band is constant.

5. Process according to claim 4, wherein the rate of linear increase in the said third band is twice the rate of linear correction in the first band.

6. Process according to claim 4, characterised in that the correction within the fourth band is 100% negative.

7. Process according to claim 6, wherein the first positive value is 10% positive and the first negative value is 10% negative.

8. Process according to claim 6, wherein the rate of linear increase in the said third band is twice the rate of linear correction in the first band.

9. Process according to claim 8, wherein the first positive value is 10% positive and the first negative value is 10% negative.

10. Electronic electricity meter for measuring chargeable electrical consumption from an electrical supply network using the steps of (a) carrying out a permanent measurement of the current of the consumer; (b) integrating the value of the measured current with respect to time until a value (A.h) is obtained relative to the electrical consumption by the consumer; (c) adjusting the integration step (b) in function of the electrical voltage of the network until an adjusted value ($A_v.h$) is obtained that is proportional to a preestablished unit of electrical consumption; and (d) computing the number of preestablished units obtained so as to obtain a value proportional to the electrical consumption chargeable up to any given moment; said meter including a circuit, without a power source, defined by a current transformer which has a primary associated with the consumer load line, the transformer having a secondary winding adapted to generate a current representative of the consumer load line current, an integrating circuit connected to said secondary winding to integrate the value of the current in the secondary winding with respect to time, detector means for detecting when the value integrated by the integrating circuit reaches a preestablished unitary value chargeable as a unit of electrical consumption and counter means associated with the detector means to sum the detected units of electrical consumption.

11. Electricity meter according to claim 10, further comprising a voltage sensor circuit for sensing the voltage in the consumer supply network and an adjustment circuit to correct said integrated value in function of the voltage detected by said sensor.

12. Electricity meter according to claim 11, wherein the said adjustment circuit determines various bands of adjustment of different properties on either side of the nominal value of the network voltage.

13. Electricity meter according to claim 12, wherein the said bands of adjustment comprise:

a first nominal voltage band on either side of the nominal voltage of the network;

a second overvoltage band following the first said band;

a third extended voltage band, lower than the first nominal band; and a fourth subvoltage band, lower than the third extended voltage band.

14. Electricity meter according to claim 13 wherein, in said first band, the correction applied by the adjustment circuit to the said integrated value varies in accordance with a first fixed rate whereas, in said third band, the correction applied by the adjustment circuit varies according to a second fixed rate that is greater than said first rate.

15. Electricity meter according to claim 14, wherein, in said second band, the correction applied by said adjustment circuit to said integrated value is a percentual that is constant and equal to that at the upper end of said first band.

16. Electricity meter according to claim 15, wherein, in said fourth band, the correction applied by said adjustment circuit to the said integrated value is a constant negative percentage.

17. Electricity meter according to claim 14, wherein, in said fourth band, the correction applied by said adjustment circuit to the said integrated value is a constant negative percentage.

18. Electricity meter according to claim 17, wherein the said constant negative percentage is −100%.

19. Electronic electricity meter for measuring chargeable electrical consumption from an electrical supply network using the steps of (a) carrying out a permanent measurement of the current of the consumer; (b) integrating the value of the measured current with respect to time until value (A.h) is obtained relative to the electrical consumption by the consumer; (c) adjusting the integration step (b) in function of the electrical voltage of the network until an adjusted value ($A_v.h$) is obtained that is proportional to a preestablished unit of electrical consumption; and (d) computing the number of preestablished units obtained so as to obtain a value proportional to the electrical consumption chargeable up to any given moment; said meter including a current sensor arranged for generating a current representative of the value of the current drawn by a consumer; a voltage sensor for generating a voltage representative of the supply network voltage fed to said consumer; a micropower source associated with said current sensor for producing a feed voltage; a display for displaying a number of preestablished units of electrical consumption detected by the meter; and an integrated circuit powered by said feed voltage from said micropower source and arranged to calculate the electrical consumption represented by said units based on the current detected by said current sensor and adjusted in accordance with variations in the voltage detected by said voltage sensor.

20. Electronic electricity meter according to claim 19, wherein said integrated circuit includes circuit means for effecting said adjustment of the electrical consumption, said adjustment being implemented in accordance with different bands of variation of the voltage detected by said voltage sensor.

21. Electronic electricity meter according to claim 20, wherein said bands comprise:

a first nominal voltage band on either side of tie nominal voltage of the network;

a second overvoltage band following the first said band;

a third extended voltage band, lower than the first nominal band; and a fourth subvoltage band, lower than the third extended voltage band.

* * * * *